United States Patent
Jayawardena et al.

(10) Patent No.: US 10,514,415 B2
(45) Date of Patent: Dec. 24, 2019

(54) PROGNOSTIC AND HEALTH MONITORING SYSTEMS FOR LIGHT FEATURES

(71) Applicant: Cooper Technologies Company, Houston, TX (US)

(72) Inventors: Adikaramge Asiri Jayawardena, Manlius, NY (US); Pulak Purkait, Pune (IN); Joseph Michael Manahan, Manlius, NY (US); Richard E. Rothenberger, Fulton, NY (US); Abhay Raosaheb Shinde, Pune (IN); Arpita Jain, Pune (IN); Sonal Satish Tanksale, Pune (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 5 days.

(21) Appl. No.: 15/382,143

(22) Filed: Dec. 16, 2016

(65) Prior Publication Data
US 2017/0184659 A1    Jun. 29, 2017

Related U.S. Application Data

(60) Provisional application No. 62/271,762, filed on Dec. 28, 2015.

(51) Int. Cl.
*G01R 31/26* (2014.01)
*H05B 37/02* (2006.01)
*H05B 33/08* (2006.01)

(52) U.S. Cl.
CPC ..... *G01R 31/2635* (2013.01); *H05B 33/0803* (2013.01); *H05B 33/0854* (2013.01); *H05B 33/0887* (2013.01); *H05B 37/0227* (2013.01)

(58) Field of Classification Search
CPC ............ G01R 31/2635; H05B 33/0854; H05B 37/0227
See application file for complete search history.

(56) References Cited

U.S. PATENT DOCUMENTS 5,578,905 A * 11/1996 Graber ...................... F21L 2/00
                                                                  315/362
5,890,797 A    4/1999 Bish
(Continued)

FOREIGN PATENT DOCUMENTS

CN    201443739    4/2010
CN    201954375    8/2011
(Continued)

OTHER PUBLICATIONS

S. Surikov, International Search Report and Written Opinion issued in application No. PCT/US2017/064443, completion date Apr. 28, 2018, dated May 10, 2018, 7 pages, Federal Institute of Industrial Property, Moscow, Russia.
(Continued)

*Primary Examiner* — Manuel L Barbee
(74) *Attorney, Agent, or Firm* — King & Spalding LLP

(57) ABSTRACT

A light fixture can include at least one light fixture component. The light fixture can also include at least one sensor that measures at least one parameter associated with the at least one light fixture component. The light fixture can further include a prognostic and health monitoring (PHM) system coupled to the at least one sensor, where the PHM system analyzes at least one measurement, made by the at least one sensor, to identify at least one factor that affects longevity of the at least one light fixture component.

20 Claims, 4 Drawing Sheets

(56) References Cited

U.S. PATENT DOCUMENTS

| | | | |
|---|---|---|---|
| 6,034,325 | A | 3/2000 | Nattel et al. |
| D592,799 | S | 5/2009 | Scott |
| 7,648,373 | B2 | 1/2010 | Dixon et al. |
| 7,741,782 | B2 | 6/2010 | Vermeulen et al. |
| D639,500 | S | 6/2011 | Choi et al. |
| 7,965,336 | B2 | 6/2011 | Bingle et al. |
| D646,016 | S | 9/2011 | Choi et al. |
| D656,262 | S | 3/2012 | Yoshinobu et al. |
| D656,263 | S | 3/2012 | Ogawa et al. |
| 8,232,909 | B2 | 7/2012 | Kroeger et al. |
| D672,480 | S | 12/2012 | Maxik et al. |
| D684,286 | S | 6/2013 | Rashidi |
| D699,889 | S | 2/2014 | Yasuji Fletcher et al. |
| 8,657,626 | B2 | 2/2014 | Duval et al. |
| D700,991 | S | 3/2014 | Johnson et al. |
| 9,404,624 | B2 | 8/2016 | Chung |
| 9,442,215 | B2 | 9/2016 | Kovacs et al. |
| D776,836 | S | 1/2017 | Tang |
| 9,626,847 | B2 | 4/2017 | Spiro |
| D802,197 | S | 11/2017 | Ding et al. |
| D803,427 | S | 11/2017 | Germain |
| D809,176 | S | 1/2018 | Partington |
| D822,859 | S | 7/2018 | Wang et al. |
| 10,260,722 | B2 | 4/2019 | Treible, Jr. et al. |
| 2004/0183744 | A1 | 9/2004 | Raiman |
| 2005/0183344 | A1 | 8/2005 | Ziobro et al. |
| 2008/0062705 | A1 | 3/2008 | Czech et al. |
| 2009/0081963 | A1 | 3/2009 | Boren |
| 2010/0270933 | A1* | 10/2010 | Chemel ............... H05B 37/029 315/130 |
| 2011/0194280 | A1 | 8/2011 | Ruffin, Jr. et al. |
| 2012/0025740 | A1 | 2/2012 | Schenk et al. |
| 2012/0206050 | A1 | 8/2012 | Spero |
| 2012/0040606 | A1 | 11/2012 | Veifuerth |
| 2012/0274208 | A1 | 11/2012 | Chen et al. |
| 2013/0021808 | A1 | 1/2013 | Harbers et al. |
| 2013/0200807 | A1* | 8/2013 | Mohan .................. H05B 37/02 315/151 |
| 2013/0314921 | A1 | 11/2013 | Chen |
| 2014/0085912 | A1 | 3/2014 | David et al. |
| 2014/0095091 | A1 | 4/2014 | Moore et al. |
| 2015/0285480 | A1 | 10/2015 | Chien et al. |
| 2015/0338074 | A1 | 11/2015 | Chen et al. |
| 2015/0351195 | A1 | 12/2015 | Sargent et al. |
| 2016/0356474 | A1 | 12/2016 | Jayawardena |
| 2017/0079121 | A1 | 3/2017 | Jayawardena et al. |
| 2017/0156189 | A1 | 6/2017 | Jayawardena et al. |
| 2017/0184659 | A1 | 6/2017 | Jayawardena et al. |

FOREIGN PATENT DOCUMENTS

| | | |
|---|---|---|
| CN | 202432348 | 9/2012 |
| WO | 2013111134 | 8/2013 |
| WO | 2016176455 | 11/2016 |

OTHER PUBLICATIONS

Translation of CN202432348 via LexisNexis Total Patents, Jun. 6, 2018, 6 pages.

Translation of CN201954375 via LexisNexis Total Patents, Jun. 6, 2018, 5 pages.

Translation of CN201443739 ia LexisNexis Total Patents, Jun. 6, 2018, 6 pages.

M. Nikitin, International Search Report and Written Opinion issued in application No. PCT/US2016/067310, completion date Feb. 15, 2017, dated Apr. 6, 2017, 7 pages, Federal Institute of Industrial Property, Moscow, Russia.

I. Istomin, International Search Report and Written Opinion issued in application No. PCT/US2017/064438, completion date Mar. 13, 2018, dated Mar. 22, 2018, 8 pages, Federal Institute of Industrial Property, Moscow, Russia.

V. Surikov, International Search Report and Written Opinion issued in application No. PCT/US2017/054961, completion date Jan. 15, 2018, dated Jan. 18, 2018, 8 pages, Federal Institute of Industrial Property, Moscow, Russia.

S. Surikov, International Search Report and Written Opinion issued in application No. PCT/US2017/054957, completion date Dec. 25, 2017, dated Jan. 25, 2018, 9 pages, Federal Institute of Industrial Property, Moscow, Russia.

* cited by examiner

PROGNOSTIC AND HEALTH MONITORING SYSTEMS FOR LIGHT FEATURES

CROSS-REFERENCE TO RELATED APPLICATIONS

This application claims priority under 35 U.S.C. § 119 to U.S. Provisional Patent Application Ser. No. 62/271,762, titled "Prognostic and Health Monitoring Systems For Light Fixtures" and filed on Dec. 28, 2015, the entire contents of which are hereby incorporated herein by reference.

TECHNICAL FIELD

The present disclosure relates generally to monitoring systems for light fixtures, and more particularly to systems, methods, and devices for prognostic and health monitoring systems for light fixtures.

BACKGROUND

Light fixtures are used in a variety of environments. Many of these light fixtures use advanced technology with a number of components. As a result, these light fixtures can have a number of failure points. In lighting applications, such as hazardous environments, reliability of the lighting system is vital. Unfortunately, the characteristics (e.g., humidity, extreme temperatures, corrosive gas) of these environments can cause the failure of one or more components of a light fixture to be accelerated.

SUMMARY

In general, in one aspect, the disclosure relates to a light fixture. The light fixture can include at least one light fixture component. The light fixture can also include at least one sensor that measures at least one parameter associated with the at least one light fixture component. The light fixture can further include a prognostic and health monitoring (PHM) system coupled to the at least one sensor, where the PHM system analyzes at least one measurement, made by the at least one sensor, to identify at least one factor that affects longevity of the at least one light fixture component.

In another aspect, the disclosure can generally relate to a prognostic and health monitoring (PHM) system for a light fixture. The PHM system can include a PHM engine that receives at least one measurement of at least one parameter associated with a light fixture component, where the PHM engine analyzes the at least one measurement to identify at least one factor that affects longevity of the light fixture component.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

DETAILED DESCRIPTION

Figure 1:
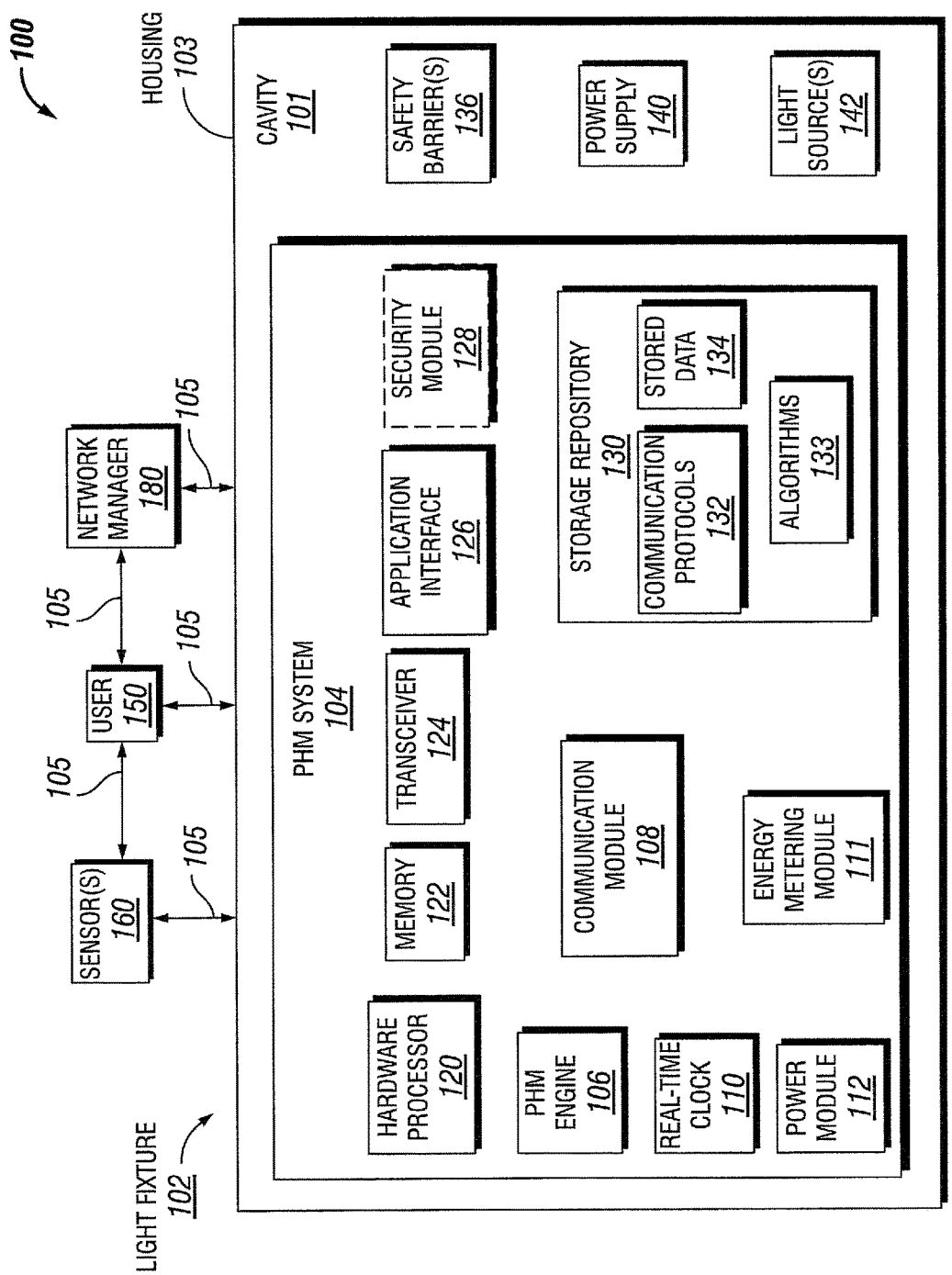
FIG. 1 shows a system diagram of a lighting system that includes a light fixture in accordance with certain example embodiments.

In general, example embodiments provide systems, methods, and devices for prognostic and health monitoring systems for light fixtures. Example prognostic and health monitoring systems for light fixtures provide a number of benefits. Such benefits can include, but are not limited to, preventing abrupt failure of light fixtures in critical applications, longer useful life of light fixtures, enable preventative maintenance practices, improved root cause diagnostics of light fixture failures, reduced operating costs, and compliance with industry standards that apply to light fixtures located in certain environments.

For example, embodiments can generate estimates of the remaining useful life of a light fixture or components thereof based on actual, real-time data. Example embodiments can predict the failure of a light fixture (or components thereof) to improve the safety of industrial environments in which the light fixture is disposed. Example embodiments can also help ensure efficient allocation of maintenance resources within a facility. Example embodiments can further provide a user with options to prolong the useful life of a light fixture or components thereof.

In some cases, the example embodiments discussed herein can be used in any type of hazardous environment, including but not limited to an airplane hangar, a drilling rig (as for oil, gas, or water), a production rig (as for oil or gas), a refinery, a chemical plant, a power plant, a mining operation, a wastewater treatment facility, and a steel mill. A user may be any person that interacts with light fixtures. Examples of a user may include, but are not limited to, an engineer, an electrician, an instrumentation and controls technician, a mechanic, an operator, a consultant, an inventory management system, an inventory manager, a foreman, a labor scheduling system, a contractor, and a manufacturer's representative.

The example light fixtures having prognostic and health monitoring systems (or components thereof, including controllers) described herein can be made of one or more of a number of suitable materials to allow the light fixture and/or other associated components of a system to meet certain standards and/or regulations while also maintaining durability in light of the one or more conditions under which the light fixtures and/or other associated components of the system can be exposed. Examples of such materials can include, but are not limited to, aluminum, stainless steel, fiberglass, glass, plastic, ceramic, and rubber.

Example light fixtures (or portions thereof) having prognostic and health monitoring systems described herein can be made from a single piece (as from a mold, injection mold, die cast, or extrusion process). In addition, or in the alternative, example light fixtures (or portions thereof) having prognostic and health monitoring systems can be made from multiple pieces that are mechanically coupled to each other. In such a case, the multiple pieces can be mechanically coupled to each other using one or more of a number of coupling methods, including but not limited to epoxy, welding, fastening devices, compression fittings, mating threads, and slotted fittings. One or more pieces that are mechanically coupled to each other can be coupled to each other in one or more of a number of ways, including but not limited to fixedly, hingedly, removeably, slidably, and threadably.

In the foregoing figures showing example embodiments of prognostic and health monitoring systems for light fixtures, one or more of the components shown may be omitted, repeated, and/or substituted. Accordingly, example embodiments of prognostic and health monitoring systems for light fixtures should not be considered limited to the specific arrangements of components shown in any of the figures. For example, features shown in one or more figures or described with respect to one embodiment can be applied to another embodiment associated with a different figure or description.

While example embodiments described herein are directed to light fixtures, prognostic and health monitoring systems can also be applied to any devices and/or components disposed within an electrical enclosure. As defined herein, an electrical enclosure is any type of cabinet or housing inside of which is disposed electrical, mechanical, electro-mechanical, and/or electronic equipment. Such equipment can include, but is not limited to, a controller (also called a control module), a hardware processor, a power supply (e.g., a battery, a driver, a ballast), a sensor module, a safety barrier, a sensor, sensor circuitry, a light source, electrical cables, and electrical conductors. Examples of an electrical enclosure can include, but are not limited to, a housing for a light fixture, a housing for a sensor device, an electrical connector, a junction box, a motor control center, a breaker box, an electrical housing, a conduit, a control panel, an indicating panel, and a control cabinet.

In certain example embodiments, light fixtures having prognostic and health monitoring systems are subject to meeting certain standards and/or requirements. For example, the National Electric Code (NEC), the National Electrical Manufacturers Association (NEMA), the International Electrotechnical Commission (IEC), the Federal Communication Commission (FCC), the Illuminating Engineering Society (IES), and the Institute of Electrical and Electronics Engineers (IEEE) set standards as to electrical enclosures, wiring, and electrical connections. Use of example embodiments described herein meet (and/or allow a corresponding device to meet) such standards when required. In some (e.g., PV solar) applications, additional standards particular to that application may be met by the electrical enclosures described herein.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three digit number and corresponding components in other figures have the identical last two digits.

In addition, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

Example embodiments of prognostic and health monitoring systems for light fixtures will be described more fully hereinafter with reference to the accompanying drawings, in which example embodiments of prognostic and health monitoring systems for light fixtures are shown. Prognostic and health monitoring systems for light fixtures may, however, be embodied in many different forms and should not be construed as limited to the example embodiments set forth herein. Rather, these example embodiments are provided so that this disclosure will be thorough and complete, and will fully convey the scope of prognostic and health monitoring systems for light fixtures to those of ordinary skill in the art. Like, but not necessarily the same, elements (also sometimes called components) in the various figures are denoted by like reference numerals for consistency.

Terms such as "first", "second", and "within" are used merely to distinguish one component (or part of a component or state of a component) from another. Such terms are not meant to denote a preference or a particular orientation, and are not meant to limit embodiments of prognostic and health monitoring systems for light fixtures. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 shows a system diagram of a lighting system 100 that includes a prognostic and health monitoring ("PHM") system 104 of a light fixture 102 in accordance with certain example embodiments. The lighting system 100 can include one or more sensors 160 (also sometimes called sensor modules 160), a user 150, a network manager 180, and at least one light fixture 102. In addition to the PHM system 104, the light fixture 102 can include at least one optional safety barrier 136, at least one power supply 140, and at least one light source 142. The PHM system 104 can include one or more of a number of components. As shown in FIG. 1, such components can include, but are not limited to, a PHM engine 106, a communication module 108, a real-time clock 110, an energy metering module 111, a power module 112, a storage repository 130, a hardware processor 120, a memory 122, a transceiver 124, an application interface 126, and, optionally, a security module 128. The components shown in FIG. 1 are not exhaustive, and in some embodiments, one or more of the components shown in FIG. 1 may not be included in an example light fixture. Any component of the example light fixture 102 can be discrete or combined with one or more other components of the light fixture 102.

The user 150 is the same as a user defined above. The user 150 can use a user system (not shown), which may include a display (e.g., a GUI). The user 150 interacts with (e.g., sends data to, receives data from) the PHM system 104 of the light fixture 102 via the application interface 126 (described below). The user 150 can also interact with a network manager 180 and/or one or more of the sensors 160.

Interaction between the user 150 and the light fixture 102, the network manager 180, and the sensors 160 is conducted using communication links 105. Each communication link 105 can include wired (e.g., Class 1 electrical cables, Class 2 electrical cables, electrical connectors, power line carrier, DALI, RS485) and/or wireless (e.g., Wi-Fi, visible light communication, cellular networking, Bluetooth, WirelessHART, ISA100) technology. For example, a communication link 105 can be (or include) one or more electrical conductors that are coupled to the housing 103 of the light fixture 102 and to a sensor 160. The communication link 105 can transmit signals (e.g., power signals, communication signals, control signals, data) between the light fixture 102 and the user 150, the network manager 180, and/or one or more of the sensors 160.

The network manager 180 is a device or component that controls all or a portion of a communication network that includes the PHM system 104 of the light fixture 102, additional light fixtures, and the sensors 160 that are communicably coupled to the PHM system 104. The network manager 180 can be substantially similar to the PHM system 104. Alternatively, the network manager 180 can include one or more of a number of features in addition to, or altered from, the features of the PHM system 104 described below. As described herein, communication with the network manager 180 can include communicating with one or more other components (e.g., another light fixture) of the system 100. In such a case, the network manager 180 can facilitate such communication.

The one or more sensors 160 can be any type of sensing device that measure one or more parameters. Examples of types of sensors 160 can include, but are not limited to, a passive infrared sensor, a photocell, a pressure sensor, an air flow monitor, a gas detector, and a resistance temperature detector. A parameter that can be measured by a sensor 160 can include, but is not limited to, motion, an amount of ambient light, temperature within the housing 103 of the light fixture 102, humidity within the housing 103 of the light fixture 102, air quality within the housing 103 of the light fixture 102, vibration, occupancy of a space, pressure, air flow, smoke (as from a fire), temperature (e.g., excessive heat, excessive cold, an ambient temperature, ambient light level) outside the housing 103 of the light fixture 102. In some cases, the parameter or parameters measured by a sensor 160 can be used to operate one or more light sources 142 of the light fixture 102. Each sensor 160 can use one or more of a number of communication protocols. A sensor 160 can be associated with the light fixture 102 or another light fixture in the system 100. A sensor 160 can be located within the housing 103 of the light fixture 102, disposed on the housing 103 of the light fixture 102, or located outside the housing 103 of the light fixture 102.

In certain example embodiments, a sensor 160 can include a battery that is used to provide power, at least in part, to some or all of the rest of the sensor 160. When the system 100 (or at least a sensor 160) is located in a hazardous environment, the sensor 160 can be intrinsically safe. As used herein, the term "intrinsically safe" refers to a device (e.g., a sensor described herein) that is placed in a hazardous environment. To be intrinsically safe, the device uses a limited amount of electrical energy so that sparks cannot occur from a short circuit or failures that can cause an explosive atmosphere found in hazardous environments to ignite. A safety barrier 136 is commonly used with an intrinsically safe device, where the safety barrier 136 limits the amount of power delivered to the sensor or other device to reduce the risk of explosion, fire, or other adverse condition that can be caused by high amounts of power in the hazardous environment. An adverse condition can also be an abnormal condition that is not potentially catastrophic in nature.

The optional safety barrier 136 can provide protection (e.g., overvoltage protection, overcurrent protection) for one or more components of the light fixture 102 when the light fixture 102 is located in a hazardous environment. For example, the safety barrier 136 can limit the amount of power delivered to the power module 112 of the controller 104 to reduce the risk of explosion, fire, or other adverse condition that can be caused by high amounts of power in the hazardous environment. The safety barrier 136 can be a required component when the light fixture 102 is located in a hazardous environment. For example, IEC 60079-11 requires that power must be less than 1.3 W during a fault condition. The safety barrier 136 can include one or more of a number of single or multiple discrete components (e.g., capacitor, inductor, transistor, diode, resistor, fuse), and/or a microprocessor.

The user 150, the network manager 180, and/or the sensors 160 can interact with the PHM system 104 of the light fixture 102 using the application interface 126 in accordance with one or more example embodiments. Specifically, the application interface 126 of the PHM system 104 receives data (e.g., information, communications, instructions, updates to firmware) from and sends data (e.g., information, communications, instructions) to the user 150, the network manager 180, and/or each sensor 160. The user 150, the network manager 180, and/or each sensor 160 can include an interface to receive data from and send data to the PHM system 104 in certain example embodiments. Examples of such an interface can include, but are not limited to, a graphical user interface, a touchscreen, an application programming interface, a keyboard, a monitor, a mouse, a web service, a data protocol adapter, some other hardware and/or software, or any suitable combination thereof.

The PHM system 104, the user 150, the network manager 180, and/or the sensors 160 can use their own system or share a system in certain example embodiments. Such a system can be, or contain a form of, an Internet-based or an intranet-based computer system that is capable of communicating with various software. A computer system includes any type of computing device and/or communication device, including but not limited to the PHM system 104. Examples of such a system can include, but are not limited to, a desktop computer with LAN, WAN, Internet or intranet access, a laptop computer with LAN, WAN, Internet or intranet access, a smart phone, a server, a server farm, an android device (or equivalent), a tablet, smartphones, and a personal digital assistant (PDA). Such a system can correspond to a computer system as described below with regard to FIG. 2.

Further, as discussed above, such a system can have corresponding software (e.g., user software, sensor software, controller software, network manager software). The software can execute on the same or a separate device (e.g., a server, mainframe, desktop personal computer (PC), laptop, PDA, television, cable box, satellite box, kiosk, telephone, mobile phone, or other computing devices) and can be coupled by the communication network (e.g., Internet, Intranet, Extranet, Local Area Network (LAN), Wide Area Network (WAN), or other network communication methods) and/or communication channels, with wire and/or wireless segments according to some example embodiments. The software of one system can be a part of, or operate separately but in conjunction with, the software of another system within the system 100.

The light fixture 102 can include a housing 103. The housing 103 can include at least one wall that forms a cavity 101. In some cases, the housing can be designed to comply with any applicable standards so that the light fixture 102 can be located in a particular environment (e.g., a hazardous environment). For example, if the light fixture 102 is located in an explosive environment, the housing 103 can be explosion-proof. According to applicable industry standards, an explosion-proof enclosure is an enclosure that is configured to contain an explosion that originates inside, or can propagate through, the enclosure.

Continuing with this example, the explosion-proof enclosure, as a Division 1 enclosure, is configured to allow gases from inside the enclosure to escape across joints of the enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface. Alternatively, if the explosion-proof enclosure is a Division 2 enclosure, then it can be gasketed to prohibit/reduce the likelihood of ingress of hazardous gas to the enclosure, but would not have any "flame-paths" should the gas get in and become ignited.

The housing 103 of the light fixture 102 can be used to house one or more components of the light fixture 102, including one or more components of the PHM system 104. For example, as shown in FIG. 1, the PHM system 104 (which in this case includes the PHM engine 106, the communication module 108, the real-time clock 110, the energy metering module 111, the power module 112, the storage repository 130, the hardware processor 120, the memory 122, the transceiver 124, the application interface 126, and the optional security module 128), the power supply 140, and the light sources 142 are disposed in the cavity 101 formed by the housing 103. In alternative embodiments, any one or more of these or other components of the light fixture 102 can be disposed on the housing 103 and/or remotely from the housing 103.

The storage repository 130 can be a persistent storage device (or set of devices) that stores software and data used to assist the PHM system 104 in communicating with the user 150, the network manager 180, and one or more sensors 160 within the system 100. In one or more example embodiments, the storage repository 130 stores one or more communication protocols 132, algorithms 133, and stored data 134. The communication protocols 132 can be any of a number of protocols that are used to send and/or receive data between the PHM system 104 and the user 150, the network manager 180, and one or more sensors 160. One or more of the communication protocols 132 can be a time-synchronized protocol. Examples of such time-synchronized protocols can include, but are not limited to, a highway addressable remote transducer (HART) protocol, a wirelessHART protocol, and an International Society of Automation (ISA) 100 protocol. In this way, one or more of the communication protocols 132 can provide a layer of security to the data transferred within the system 100.

The algorithms 133 can be any procedures (e.g., a series of method steps, such as those shown and described below with respect to FIG. 5), formulas, logic steps, mathematical models, forecasts, simulations, and/or other similar operational procedures that the PHM engine 106 of the PHM system 104 follows based on certain conditions at a point in time. An example of an algorithm 133 is measuring (using the energy metering module 111), storing (using the stored data 134 in the storage repository 130), and evaluating the current and voltage delivered to and delivered by the power supply 140 over time.

Algorithms 133 can be focused on certain components of the light fixture 102. For example, there can be one or more algorithms 133 that focus on the integrity of the housing 103 of the light fixture 102. One such example of an algorithm 133 is predicting the life of a gasket (disposed, for example, between a cover and a body of the housing 103) of the light fixture 102 based on the temperature within the cavity 101 (as measured by a sensor 160 and stored as stored data 134) and the characteristics of the gasket material (stored as stored data 134).

Another such example of an algorithm 133 is predicting the integrity of a gasket of the light fixture 102 by measuring air quality (using a sensor 160) inside the cavity 103 proximate to the gasket over time, and determining that the gasket needs to be replaced when the air quality falls outside a range of normal values stored as stored data 134 (e.g., exceeds a threshold value). Still another such example of an algorithm 133 is monitoring moisture levels (as measured by a sensor 160 and stored as stored data 134) within the housing 103 over time and notifying the user that there is a leak in the housing 103 when moisture levels exceed a threshold value (stored as stored data 134).

As yet another example, if a sensor 160 is an air quality sensor capable of measuring volatile organic compounds (VOCs) or dust particle concentration over time, one or more algorithms 133 can be used to determine a failure of a sealing member (e.g., a gasket) of the light fixture 102. As another example, if a sensor 160 is a gas sensor placed within the optical cavity (e.g., in a volume of space defined by a lens proximate to the light sources 142) of the light fixture 102, and if the sensor 160 can measure explosive gas concentrations (e.g., $H_2$, $CH_4$), one or more algorithms 133 can be used to determine if an explosive gas concentration exceeds a threshold value, creating a hazardous situation.

One or more algorithms 133 used in example embodiments can also be used to detect, in real time, instantaneous failures of one or more components of the light fixture 102. For example, if a power spike (e.g., a fault) at the power supply 140 is measured by the energy metering module 111, the PHM engine 106 can use one or more algorithms 133 to instantaneously, in real time, compare the excessively high voltage reading with a threshold value, determine that the voltage measurement represents a fault, and takes immediate action (e.g., opens a switch to stop receiving power from the source of the fault, uses a secondary source of power to maintain the operation of the light fixture 102) to minimize damage to the components of the light fixture 102 that can be caused by the fault and maintain a safe operating environment (e.g., allow the light sources 142 to continue to receive power to continue emitting light) in the area of the light fixture 102.

Further, one or more algorithms 133 can track undervoltage conditions that are outside the design limits (e.g., threshold values) to assess damage to one or more of the components (e.g., PHM system 104, power supply 140) of the light fixture 102 due to over-heating caused by the under-voltage conditions. One or more algorithms 133 can also track transient voltage and current fluctuations that do not cause any severe damage to one or more components of the light fixture 102 in the short-term, but that can cause severe damage to those components when accumulated over a period of time. This data would improve intelligence on facility power system and lead to more robust design of one or more components (e.g., electronics) of the light fixture 102.

One or more algorithms 133 can be based on a "canary-in-a-coalmine" principal, where a redundant component is added to the light fixture 102 and is designed to fail prior to the other components serving the same function. When the redundant component fails, the other components serving the same function may be approaching failure, as well. As an example, with the light sources 142 use LED technology, a strip of LEDs (the "canary") that operate at a higher temperature relative to the rest of the LEDs (light sources 142) can be monitored (using one or more sensors 160) over time. When the "canary" light sources 142 begin to fail, an algorithm 133 can determine how far behind the other light sources 142 are from failing.

Other algorithms 133 can be directed to the light sources 142 of the light fixture 102. For example, lumen depreciation data collected under the LM-80 standard, developed by the IES, and published by LED package manufacturers can be stored as stored data 134 and compared with temperatures (as measured by one or more sensors 160 and stored as stored data 134) of light sources 142 of the light fixture 102 to see if a correlation can be developed. As another example, when one or more light sources 142 of the light fixture 102 are determined to begin failing, the algorithm 133 can direct the PHM engine 106 to generate an alarm for predictive maintenance.

As example, an algorithm 133 can be to continuously monitor the current (as measured by the energy metering module 111 and stored as stored data 134) output by the power supply 140 and the reference current. In addition to the dimmer setting, the algorithm can detect variations of the output current of the power supply 140 and the reference current for a given dimmer setting and predict failure of the power supply 140. In such a case, the direction of the variation can dictate whether there is a short circuit or an open circuit involved.

Another example algorithm 133 can be to measure and analyze the current output and current ripple of the power supply 140 over time. If the current ripple relative to the current output exceeds a threshold value, then the power supply 140 can be classified as failed. Yet another example algorithm 133 can be to monitor a temperature of a critical component (e.g., electrolytic capacitors, Controller IC, Blocking diode, TVS) of the power supply 140 over time. The estimated remaining life of the power supply 140 can be based on degradation curves of those components and threshold values established for those components.

Still another example algorithm 133 can be to measure and analyze the equivalent series resistance of the output electrolytic capacitors of the power supply 140 over time. An alarm can be generated by the PHM engine 106 when the resistance exceeds a threshold value, indicating failure of the power supply 140. Yet another example algorithm 133 can be to measure and analyze the magnitude and number of surges (ringing waves) that the power supply 140 is subjected to over time. The algorithm 133 can predict the expected useful life of the power supply 140 based on a threshold value. Still another example algorithm 133 can be to measure and analyze the efficiency of the power supply 140 over time. An alarm can be generated by the PHM engine 106 when the efficiency of the power supply 140 falls below a threshold value, indicating failure of the power supply 140.

An algorithm 133 can be based on stress models. For example, an algorithm 133 can develop a stress versus life relationship using accelerated life testing for the light fixture 102 or a component thereof. One instance would be an actual lifetime temperature of the power supply 140 versus a modeled or estimated temperature profile of the power supply 140. Another instance would be using LM-80 test data developed for the light sources 142.

As another example, an algorithm 133 can measure and analyze real-time application stress conditions of the light fixture 102 or components thereof over time and use developed models to estimate the life of the light fixture or components thereof. In such a case, mathematical models can be developed using one or more mathematical theories (e.g., Arrhenius theory, Palmgran-Miner Rules) to predict useful life of the light fixture 102 or components thereof under real stress conditions. As yet another example, an algorithm 133 can use predicted values and actual data to estimate the remaining life of the light fixture 102 or components thereof.

Stored data 134 can be any data associated with the light fixture 102 (including other light fixtures and/or any components thereof), any measurements taken by the sensors 160, measurements taken by the energy metering module 111, threshold values, results of previously run or calculated algorithms, and/or any other suitable data. Such data can be any type of data, including but not limited to historical data for the light fixture 102, historical data for other light fixtures, calculations, measurements taken by the energy metering module 111, and measurements taken by one or more sensors 160. The stored data 134 can be associated with some measurement of time derived, for example, from the real-time clock 110.

Examples of a storage repository 130 can include, but are not limited to, a database (or a number of databases), a file system, a hard drive, flash memory, some other form of solid state data storage, or any suitable combination thereof. The storage repository 130 can be located on multiple physical machines, each storing all or a portion of the communication protocols 132, the algorithms 133, and/or the stored data 134 according to some example embodiments. Each storage unit or device can be physically located in the same or in a different geographic location.

The storage repository 130 can be operatively connected to the PHM engine 106. In one or more example embodiments, the PHM engine 106 includes functionality to communicate with the user 150, the network manager 180, and the sensors 160 in the system 100. More specifically, the PHM engine 106 sends information to and/or receives information from the storage repository 130 in order to communicate with the user 150, the network manager 180, and the sensors 160. As discussed below, the storage repository 130 can also be operatively connected to the communication module 108 in certain example embodiments.

In certain example embodiments, the PHM engine 106 of the PHM system 104 controls the operation of one or more components (e.g., the communication module 108, the real-time clock 110, the transceiver 124) of the PHM system 104. For example, the PHM engine 106 can activate the communication module 108 when the communication module 108 is in "sleep" mode and when the communication module 108 is needed to send data received from another component (e.g., a sensor 160, the user 150) in the system 100.

As another example, the PHM engine 106 can acquire the current time using the real-time clock 110. The real time clock 110 can enable the PHM system 104 to control the light fixture 102 even when the PHM system 104 has no communication with the network manager 180. As yet another example, the PHM engine 106 can direct the energy metering module 111 to measure and send power consumption information of the light fixture 102 to the network manager 180. In some cases, the PHM engine 106 of the PHM system 104 can generate and send a dimming signal (e.g., 0-10 V DC) to the power supply 140, which causes the power supply 140 to adjust the light output of the light sources 142.

The PHM engine 106 can be configured to perform a number of functions that help prognosticate and monitor the health of the light fixture 102 (or components thereof), either continually or on a periodic basis. In other words, the PHM engine 106 analyzes one or more factors that can affect the longevity (e.g., the performance, reliability) of one or more components of the light fixture 102. For example, the PHM engine 106 can execute any of the algorithms 133 stored in the storage repository 130. As a specific example, the PHM engine 106 can measure (using the energy metering module 111), store (as stored data 134 in the storage repository 130), and evaluate, using an algorithm 133, the current and voltage delivered to and delivered by the power supply 140 over time.

As another specific example, the PHM engine 106 can use one or more algorithms 133 that focus on certain components of the light fixture 102. For example, the PHM engine 106 can use one or more algorithms 133 that focus on the integrity of the housing 103 of the light fixture 102. As stated above, one such example of an algorithm 133 is predicting the life of a gasket (disposed, for example, between a cover and a body of the housing 103) of the light fixture 102 based on the temperature within the cavity 101 (as measured by a sensor 160 and stored as stored data 134) and the characteristics of the gasket material (stored as stored data 134). In such a case, the PHM engine 106 can control the sensors 160 that perform the measurements.

The PHM engine 106 can also predict the integrity of a gasket of the light fixture 102 by measuring air quality (using a sensor 160) inside the cavity 103 proximate to the gasket over time, and determining that the gasket needs to be replaced when the air quality falls outside a range of normal values (as stored as stored data 134 ((e.g., exceeds a threshold value). The PHM engine 106 can also monitor moisture levels (as measured by a sensor 160 and stored as stored data 134) within the housing 103 over time and notify the user that there is a leak in the housing 103 when moisture levels exceed a threshold value (as stored as stored data 134).

As yet another example, the PHM engine 106 can determine a failure of a sealing member (e.g., a gasket) of the light fixture 102. In such a case, a sensor 160 can be an air quality sensor capable of measuring volatile organic compounds (VOCs) or dust particle concentration over time, and the PHM engine 106 can use one or more algorithms 133, along with the measurements made by one or more sensors 106, to determine (or predict the likelihood of) failure of the sealing member. As another example, the PHM engine 106 can determine if an explosive gas concentration exceeds a threshold value, creating a hazardous situation. In such a case, a sensor 160 can be a gas sensor placed within the optical cavity (e.g., in a volume of space defined by a lens proximate to the light sources 142) of the light fixture 102, and the PHM engine 106 can use measurements of explosive gas concentrations (e.g., $H_2$, $CH_4$) made by the sensor 160, in conjunction with one or more algorithms 133, to determine if an explosive gas concentration is high.

The PHM engine 106 can also detect, in real time, instantaneous failures of one or more components of the light fixture 102. For example, if a power spike (e.g., a fault) at the power supply 140 is measured by the energy metering module 111, the PHM engine 106 can instantaneously, in real time, compare the excessively high voltage reading with a threshold value, determine that the voltage measurement represents a fault, and takes immediate action (e.g., opens a switch to stop receiving power from the source of the fault, uses a secondary source of power to maintain the operation of the light fixture 102) to minimize damage to the components of the light fixture 102 that can be caused by the fault and maintain a safe operating environment (e.g., allow the light sources 142 to continue to receive power to continue emitting light) in the area of the light fixture 102.

Further, the PHM engine 106 can track (using measurements from one or more sensors 160 and one or more algorithms 133) under-voltage conditions that are outside of design limits (e.g., threshold values) to assess damage to one or more of the components (e.g., PHM system 104, power supply 140) of the light fixture 102 due to over-heating caused by the under-voltage conditions. The PHM engine 106 can also track, using one or more sensors 160 and one or more algorithms 133, transient voltage and current fluctuations that do not cause any severe damage to one or more components of the light fixture 102 in the short-term, but that can cause severe damage to those components when accumulated over a period of time. In this way, the PHM engine 106 can proactively improve intelligence on facility power systems and lead to more robust design of one or more components (e.g., electronics) of the light fixture 102.

The PHM engine 106 can use a "canary-in-a-coalmine" principal, where a redundant component is added to the light fixture 102 and is designed to fail prior to the other components serving the same function. When the redundant component fails, the other components serving the same function may be approaching failure, as well. As an example, with the light sources 142 that use LED technology, a strip of LEDs (the "canary") that operate at a higher temperature relative to the rest of the LEDs (light sources 142) can be monitored (using one or more sensors 160) by the PHM engine 106 over time. When the "canary" light sources 142 begin to fail, the PHM engine 106 can determine, using one or more algorithms 133, how far behind the other light sources 142 are from failing.

The PHM engine 106 can also collect data, under the LM-80 standard, of one or more light sources 142, store the data as stored data 134, and compare this data with temperatures (as measured by one or more sensors 160 and stored as stored data 134) of light sources 142 of the light fixture 102 to see if a correlation can be developed. For instance, data generated by a component manufacturer (e.g., information about the light source 142 listed on the packaging for the light fixture 102) using a reliability testing protocols (e.g., IES LM-80) can be used to generate stress versus life correlation models. Subsequently, those models can be stored in the storage repository 130 as algorithms 133 by the PHM engine 106. The real-time stress information collected in the application environment using multiple sensors 160 can be used by the PHM engine 106, along with stress-life models stored in storage repository 130, to predict the useful life of the light fixture 102 and/or components thereof. As another example, the PHM engine 106 can determine whether one or more light sources 142 of the light fixture 102 are failing and generate an alarm for predictive maintenance.

As another example, the PHM engine 106 can be used to continuously monitor the current (as measured by the energy metering module 111 and stored as stored data 134) output by the power supply 140 and the reference current. The PHM engine 106 can also determine the dimmer setting, and so detect variations of the output current of the power supply 140 and the reference current for a given dimmer setting and predict failure of the power supply 140. In such a case, the direction of the variation can dictate whether there is a short circuit or an open circuit involved.

As yet another example, the PHM engine 106 can measure (using one or more sensors 160) and analyze the current output and current ripple of the power supply 140 over time. If the current ripple (e.g., peak-to-peak ripple current, RMS current) relative to the current output exceeds a threshold value, then the PHM engine 106 can classify the power supply 140 as failed. As still another example, the PHM engine 106 can monitor a temperature (using one or more sensors 160) of a critical component (e.g., electrolytic capacitors, Controller IC, Blocking diode, TVS) of the power supply 140 over time. The PHM engine 106 can estimate the remaining life of the power supply 140 based on degradation curves of those components and threshold values established for those components.

The PHM engine 106 can also measure (using one or more sensors 160) and analyze the equivalent series resistance of the output electrolytic capacitors of the power supply 140 over time. In such a case, the PHM engine 106 can generate an alarm when the resistance exceeds a threshold value, indicating failure of the power supply 140. The PHM engine 106 can further measure (using one or more sensors 160) and analyze the magnitude and number of surges (ringing waves) that the power supply 140 is subjected to over time. Using an algorithm 133, the PHM engine 106 can predict the expected useful life of the power supply 140 based on a threshold value. The PHM engine 106 can also measure (using one or more sensors 160) and analyze the efficiency of the power supply 140 over time. An alarm can be generated by the PHM engine 106 when the efficiency of the power supply 140 falls below a threshold value, indicating failure of the power supply 140.

The PHM engine 106 can provide control, communication, and/or other similar signals to the user 150, the network manager 180, and one or more of the sensors 160. Similarly, the PHM engine 106 can receive control, communication, and/or other similar signals from the user 150, the network manager 180, and one or more of the sensors 160. The PHM engine 106 can control each sensor 160 automatically (for example, based on one or more algorithms stored in the PHM engine 106) and/or based on control, communication, and/or other similar signals received from another device through a communication link 105. The PHM engine 106 may include a printed circuit board, upon which the hardware processor 120 and/or one or more discrete components of the PHM system 104 are positioned.

The PHM engine 106 can be located in the physical memory 122 available within the light fixture 102, on an application server, in cloud infrastructure, and/or in any other suitable platform and/or location. In some cases, the PHM engine 106 can exist in all or some of these platforms and/or locations simultaneously. In such instances, varying complexity of analysis can be performed at these platforms and/or locations. For example, data threshold type analysis can be performed at the light fixture level, whereas trend or statistical analysis that requires significant data mining can be performed at the application server or cloud database level.

In certain embodiments, the PHM engine 106 of the PHM system 104 can communicate with one or more components of a system external to the system 100 in furtherance of prognostications and evaluations of the light fixture 102. For example, the PHM engine 106 can interact with an inventory management system by ordering a light fixture (or one or more components thereof) to replace the light fixture 102 (or one or more components thereof) that the PHM engine 106 has determined to fail or be failing. As another example, the PHM engine 106 can interact with a workforce scheduling system by scheduling a maintenance crew to repair or replace the light fixture 102 (or portion thereof) when the PHNM engine 106 determines that the light fixture 102 or portion thereof requires maintenance or replacement. In this way, the PHM system 104 is capable of performing a number of functions beyond what could reasonably be considered a routine task.

In certain example embodiments, the PHM engine 106 can include an interface that enables the PHM engine 106 to communicate with one or more components (e.g., power supply 140) of the light fixture 102. For example, if the power supply 140 of the light fixture 102 operates under IEC Standard 62386, then the power supply 140 can have a serial communication interface that will transfer data (e.g., stored data 134) measured by the sensors 160. In such a case, the PHM engine 106 can also include a serial interface to enable communication with the power supply 140 within the light fixture 102. Such an interface can operate in conjunction with, or independently of, the communication protocols 132 used to communicate between the PHM system 104 and the user 150, the network manager 180, and the sensors 160.

The PHM engine 106 (or other components of the PHM system 104) can also include one or more hardware components and/or software elements to perform its functions. Such components can include, but are not limited to, a universal asynchronous receiver/transmitter (UART), a serial peripheral interface (SPI), a direct-attached capacity (DAC) storage device, an analog-to-digital converter, an inter-integrated circuit ($I^2C$), and a pulse width modulator (PWM).

The communication module 108 of the PHM system 104 determines and implements the communication protocol (e.g., from the communication protocols 132 of the storage repository 130) that is used when the PHM engine 106 communicates with (e.g., sends signals to, receives signals from) the user 150, the network manager 180, and/or one or more of the sensors 160. In some cases, the communication module 108 accesses the stored data 134 to determine which communication protocol is used to communicate with the sensor 160 associated with the stored data 134. In addition, the communication module 108 can interpret the communication protocol of a communication received by the PHM system 104 so that the PHM engine 106 can interpret the communication.

The communication module 108 can send and receive data between the network manager 180, the sensors 160, and/or the users 150 and the PHM system 104. The communication module 108 can send and/or receive data in a given format that follows a particular communication protocol 132. The PHM engine 106 can interpret the data packet received from the communication module 108 using the communication protocol 132 information stored in the storage repository 130. The PHM engine 106 can also facilitate the data transfer between one or more sensors 160 and the network manager 180 or a user 150 by converting the data into a format understood by the communication module 108.

The communication module 108 can send data (e.g., communication protocols 132, algorithms 133, stored data 134, operational information, alarms) directly to and/or retrieve data directly from the storage repository 130. Alternatively, the PHM engine 106 can facilitate the transfer of data between the communication module 108 and the storage repository 130. The communication module 108 can also provide encryption to data that is sent by the PHM system 104 and decryption to data that is received by the PHM system 104. The communication module 108 can also provide one or more of a number of other services with respect to data sent from and received by the PHM system 104. Such services can include, but are not limited to, data packet routing information and procedures to follow in the event of data interruption.

The real-time clock 110 of the PHM system 104 can track clock time, intervals of time, an amount of time, and/or any other measure of time. The real-time clock 110 can also count the number of occurrences of an event, whether with or without respect to time. Alternatively, the PHM engine 106 can perform the counting function. The real-time clock 110 is able to track multiple time measurements concurrently. The real-time clock 110 can track time periods based on an instruction received from the PHM engine 106, based on an instruction received from the user 150, based on an instruction programmed in the software for the PHM system 104, based on some other condition or from some other component, or from any combination thereof.

The real-time clock 110 can be configured to track time when there is no power delivered to the PHM system 104 (e.g., the power module 112 malfunctions) using, for example, a super capacitor or a battery backup. In such a case, when there is a resumption of power delivery to the PHM system 104, the real-time clock 110 can communicate any aspect of time to the PHM system 104. In such a case, the real-time clock 110 can include one or more of a number of components (e.g., a super capacitor, an integrated circuit) to perform these functions.

The energy metering module 111 of the PHM system 104 measures one or more components of power (e.g., current, voltage, resistance, VARs, watts) at one or more points within the light fixture 102. The energy metering module 111 can include any of a number of measuring devices and related devices, including but not limited to a voltmeter, an ammeter, a power meter, an ohmmeter, a current transformer, a potential transformer, and electrical wiring. The energy metering module 111 can measure a component of power continuously, periodically, based on the occurrence of an event, based on a command received from the control module 106, and/or based on some other factor. For purposes herein, the energy metering module 111 can be considered a type of sensor (e.g., sensor 160). In this way, a component of power measured by the energy metering module 111 can be considered a parameter herein.

The power module 112 of the PHM system 104 provides power to one or more other components (e.g., real-time clock 110, PHM engine 106) of the PHM system 104. In addition, in certain example embodiments, the power module 112 can provide power to the power supply 140 of the light fixture 102. The power module 112 can include one or more of a number of single or multiple discrete components (e.g., transistor, diode, resistor), and/or a microprocessor. The power module 112 may include a printed circuit board, upon which the microprocessor and/or one or more discrete components are positioned. In some cases, the power module 112 can include one or more components that allow the power module 112 to measure one or more elements of power (e.g., voltage, current) that is delivered to and/or sent from the power module 112, Alternatively, the PHM system 104 can include a power metering module (not shown) to measure one or more elements of power that flows into, out of, and/or within the PHM system 104. Such a power metering module can also be considered a type of sensor (e.g., sensor 160) herein.

The power module 112 can include one or more components (e.g., a transformer, a diode bridge, an inverter, a converter) that receives power (for example, through an electrical cable) from a source external to the light fixture 102 and generates power of a type (e.g., alternating current, direct current) and level (e.g., 12V, 24V, 120V) that can be used by the other components of the PHM system 104 and/or by the power supply 140. The power module 112 can use a closed control loop to maintain a preconfigured voltage or current with a tight tolerance at the output. The power module 112 can also protect the rest of the electronics (e.g., hardware processor 120, transceiver 124) in the light fixture 102 from surges generated in the line.

In addition, or in the alternative, the power module 112 can be a source of power in itself to provide signals to the other components of the PHM system 104 and/or the power supply 140. For example, the power module 112 can be a battery. As another example, the power module 112 can be a localized photovoltaic power system. The power module 112 can also have sufficient isolation in the associated components of the power module 112 (e.g., transformers, opto-couplers, current and voltage limiting devices) so that the power module 112 is certified to provide power to an intrinsically safe circuit.

In certain example embodiments, the power module 112 of the PHM system 104 can also provide power and/or control signals, directly or indirectly, to one or more of the sensors 160. In such a case, the PHM engine 106 can direct the power generated by the power module 112 to the sensors 160 and/or the power supply 140 of the light fixture 102. In this way, power can be conserved by sending power to the sensors 160 and/or the power supply 140 of the light fixture 102 when those devices need power, as determined by the PHM engine 106.

The hardware processor 120 of the PHM system 104 executes software, algorithms, and firmware in accordance with one or more example embodiments. Specifically, the hardware processor 120 can execute software on the PHM engine 106 or any other portion of the PHM system 104, as well as software used by the user 150, the network manager 180, and/or one or more of the sensors 160. The hardware processor 120 can be an integrated circuit, a central processing unit, a multi-core processing chip, SoC, a multi-chip module including multiple multi-core processing chips, or other hardware processor in one or more example embodiments. The hardware processor 120 is known by other names, including but not limited to a computer processor, a microprocessor, and a multi-core processor.

In one or more example embodiments, the hardware processor 120 executes software instructions stored in memory 122. The memory 122 includes one or more cache memories, main memory, and/or any other suitable type of memory. The memory 122 can include volatile and/or non-volatile memory. The memory 122 is discretely located within the PHM system 104 relative to the hardware processor 120 according to some example embodiments. In certain configurations, the memory 122 can be integrated with the hardware processor 120.

In certain example embodiments, the PHM system 104 does not include a hardware processor 120. In such a case, the PHM system 104 can include, as an example, one or more field programmable gate arrays (FPGA), one or more insulated-gate bipolar transistors (IGBTs), one or more integrated circuits (ICs). Using FPGAs, IGBTs, ICs, and/or other similar devices known in the art allows the PHM system 104 (or portions thereof) to be programmable and function according to certain logic rules and thresholds without the use of a hardware processor. Alternatively, FPGAs, IGBTs, ICs, and/or similar devices can be used in conjunction with one or more hardware processors 120.

The transceiver 124 of the PHM system 104 can send and/or receive control and/or communication signals. Specifically, the transceiver 124 can be used to transfer data between the PHM system 104 and the user 150, the network manager 180, and/or the sensors 160. The transceiver 124 can use wired and/or wireless technology. The transceiver 124 can be configured in such a way that the control and/or communication signals sent and/or received by the transceiver 124 can be received and/or sent by another transceiver that is part of the user 150, the network manager 180, and/or the sensors 160. The transceiver 124 can use any of a number of signal types, including but not limited to radio signals.

When the transceiver 124 uses wireless technology, any type of wireless technology can be used by the transceiver 124 in sending and receiving signals. Such wireless technology can include, but is not limited to, Wi-Fi, visible light communication, cellular networking, and Bluetooth. The transceiver 124 can use one or more of any number of suitable communication protocols (e.g., ISA100, HART) when sending and/or receiving signals. Such communication protocols can be stored in the communication protocols 132 of the storage repository 130. Further, any transceiver information for the user 150, the network manager 180, and/or the sensors 160 can be part of the stored data 134 (or similar areas) of the storage repository 130.

Optionally, in one or more example embodiments, the security module 128 secures interactions between the PHM system 104, the user 150, the network manager 180, and/or the sensors 160. More specifically, the security module 128 authenticates communication from software based on security keys verifying the identity of the source of the communication. For example, user software may be associated with a security key enabling the software of the user 150 to interact with the PHM system 104 and/or the sensors 160. Further, the security module 128 can restrict receipt of information, requests for information, and/or access to information in some example embodiments.

As mentioned above, aside from the PHM system 104 and its components, the light fixture 102 can include a power supply 140 and one or more light sources 142. The light sources 142 of the light fixture 102 are devices and/or components typically found in a light fixture to allow the light fixture 102 to operate. The light fixture 102 can have one or more of any number and/or type of light sources 142. Examples of such light sources 142 can include, but are not limited to, a local control module, a light source, a light engine, a heat sink, an electrical conductor or electrical cable, a terminal block, a lens, a diffuser, a reflector, an air moving device, a baffle, a dimmer, and a circuit board. A light source 142 can use any type of lighting technology, including but not limited to LED, incandescent, sodium vapor, and fluorescent.

The power supply 140 of the light fixture 102 provides power to one or more of the light sources 142. The power supply 140 can be called by any of a number of other names, including but not limited to a driver, a LED driver, and a ballast. The power supply 140 can be substantially the same as, or different than, the power module 112 of the PHM system 104. The power supply 140 can include one or more of a number of single or multiple discrete components (e.g., transistor, diode, resistor), and/or a microprocessor. The power supply 140 may include a printed circuit board, upon which the microprocessor and/or one or more discrete components are positioned, and/or a dimmer.

The power supply 140 can include one or more components (e.g., a transformer, a diode bridge, an inverter, a converter) that receives power (for example, through an electrical cable) from the power module 112 of the PHM system 104 and generates power of a type (e.g., alternating current, direct current) and level (e.g., 12V, 24V, 120V) that can be used by the light sources 142. In addition, or in the alternative, the power supply 140 can receive power from a source external to the light fixture 102. In addition, or in the alternative, the power supply 140 can be a source of power in itself. For example, the power supply 140 can be a battery, a localized photovoltaic power system, or some other source of independent power.

As stated above, the light fixture 102 can be placed in any of a number of environments. In such a case, the housing 102 of the light fixture 102 can be configured to comply with applicable standards for any of a number of environments. For example, the light fixture 102 can be rated as a Division 1 or a Division 2 enclosure under NEC standards. Similarly, any of the sensors 160 or other devices communicably coupled to the light fixture 102 can be configured to comply with applicable standards for any of a number of environments. For example, a sensor 160 can be rated as a Division 1 or a Division 2 enclosure under NEC standards.

Figure 2:
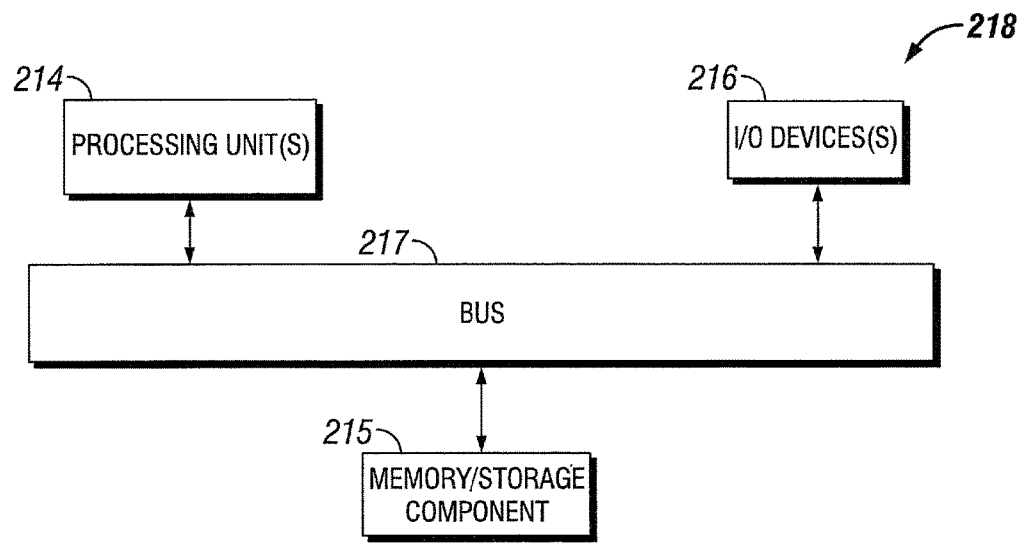
FIG. 2 shows a computing device in accordance with certain example embodiments.

FIG. 2 illustrates one embodiment of a computing device 218 that implements one or more of the various techniques described herein, and which is representative, in whole or in part, of the elements described herein pursuant to certain exemplary embodiments. Computing device 218 is one example of a computing device and is not intended to suggest any limitation as to scope of use or functionality of the computing device and/or its possible architectures. Neither should computing device 218 be interpreted as having any dependency or requirement relating to any one or combination of components illustrated in the example computing device 218.

Computing device 218 includes one or more processors or processing units 214, one or more memory/storage components 215, one or more input/output (I/O) devices 216, and a bus 217 that allows the various components and devices to communicate with one another. Bus 217 represents one or more of any of several types of bus structures, including a memory bus or memory controller, a peripheral bus, an accelerated graphics port, and a processor or local bus using any of a variety of bus architectures. Bus 217 includes wired and/or wireless buses.

Memory/storage component 215 represents one or more computer storage media. Memory/storage component 215 includes volatile media (such as random access memory (RAM)) and/or nonvolatile media (such as read only memory (ROM), flash memory, optical disks, magnetic disks, and so forth). Memory/storage component 215 includes fixed media (e.g., RAM, ROM, a fixed hard drive, etc.) as well as removable media (e.g., a Flash memory drive, a removable hard drive, an optical disk, and so forth).

One or more I/O devices 216 allow a customer, utility, or other user to enter commands and information to computing device 218, and also allow information to be presented to the customer, utility, or other user and/or other components or devices. Examples of input devices include, but are not limited to, a keyboard, a cursor control device (e.g., a mouse), a microphone, a touchscreen, and a scanner. Examples of output devices include, but are not limited to, a display device (e.g., a monitor or projector), speakers, outputs to a lighting network (e.g., DMX card), a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 218 is connected to a network (not shown) (e.g., a local area network (LAN), a wide area network (WAN) such as the Internet, cloud, or any other similar type of network) via a network interface connection (not shown) according to some exemplary embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other exemplary embodiments. Generally speaking, the computer system 218 includes at least the minimal processing, input, and/or output means necessary to practice one or more embodiments.

Further, those skilled in the art will appreciate that one or more elements of the aforementioned computer device 218 is located at a remote location and connected to the other elements over a network in certain exemplary embodiments. Further, one or more embodiments is implemented on a distributed system having one or more nodes, where each portion of the implementation (e.g., PHM engine 106) is located on a different node within the distributed system. In one or more embodiments, the node corresponds to a computer system. Alternatively, the node corresponds to a processor with associated physical memory in some exemplary embodiments. The node alternatively corresponds to a processor with shared memory and/or resources in some exemplary embodiments.

Figure 3:
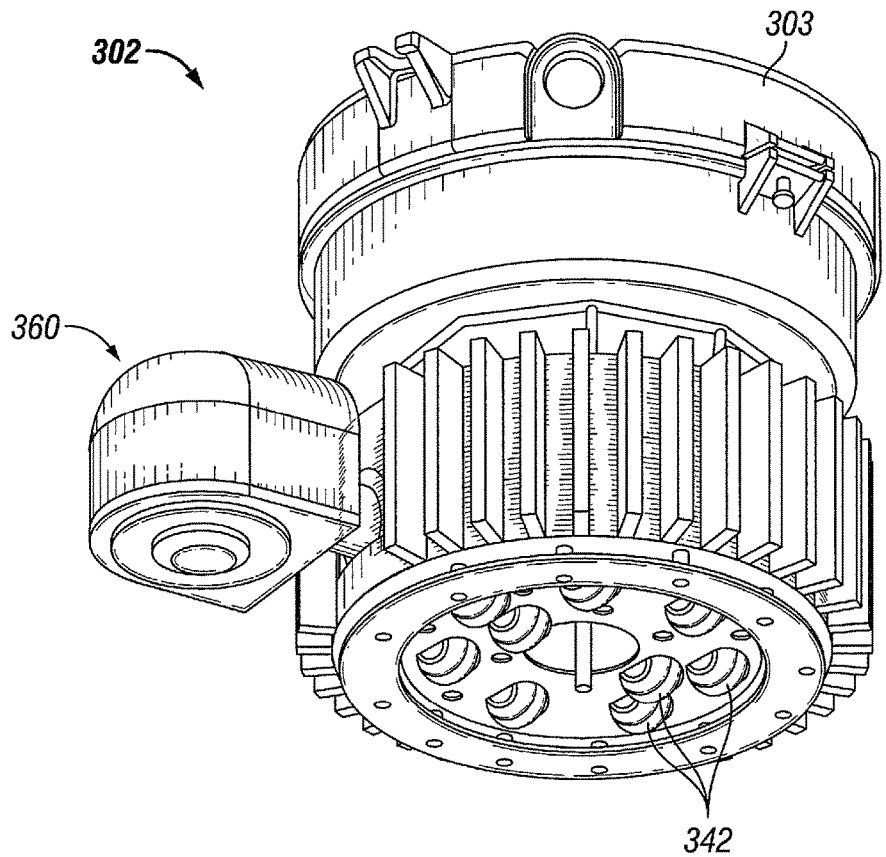
FIG. 3 shows a light fixture in accordance with certain example embodiments.

FIG. 3 shows a light fixture 302 in accordance with certain example embodiments. Referring to FIGS. 1-3, the light fixture 302 of FIG. 3 is the physical embodiment of the light fixture 102 of FIG. 1. The light fixture 302 of FIG. 3 includes a housing 303, a number of light sources 342, and a sensor 360 coupled to the housing 303.

Figure 4:
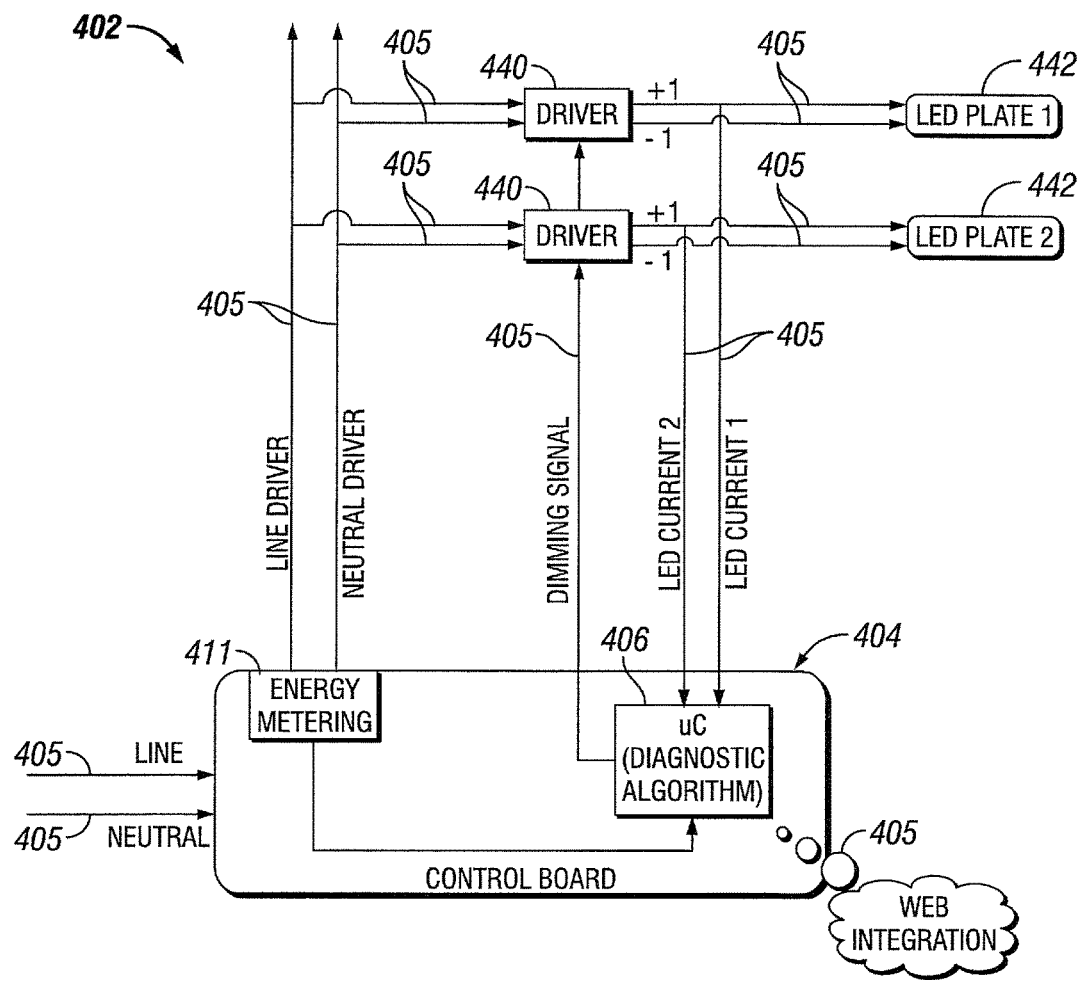
FIG. 4 shows a system diagram of a light fixture in accordance with certain example embodiments.

FIG. 4 shows a system diagram of a light fixture 402 in accordance with certain example embodiments. Referring to FIGS. 1-4, the light fixture 402 of FIG. 4 is substantially similar to the light fixture 102 of FIG. 1, except that only the PHM engine 406 and the energy metering module 411 of the PHM system 404 are expressly shown in FIG. 4. Also, the internal connections (communication links 405) are shown between the PHM system 404, the power supplies 440, and the light sources 442. Further, FIG. 4 shows that the PHM engine 406 generates a dimming signal that is used by the power supplies 440 to adjust the output of the light sources 442.

Figure 5:
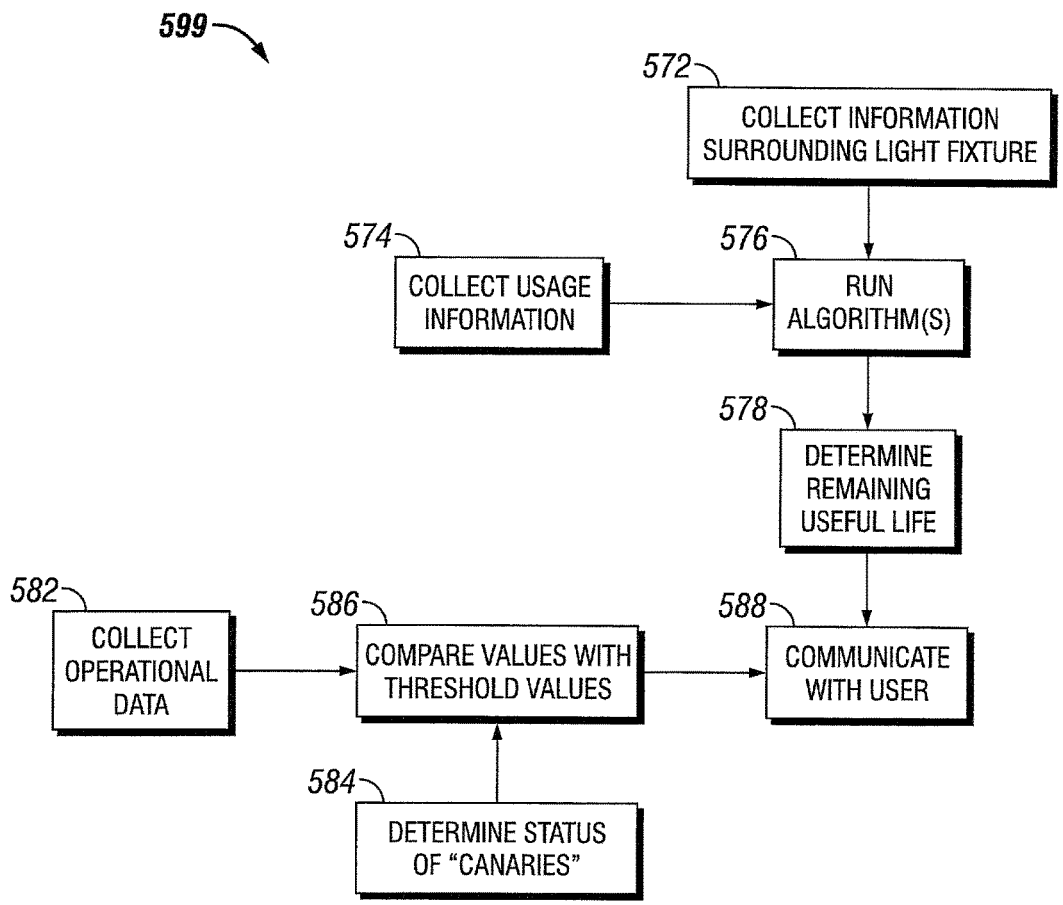
FIG. 5 is a flowchart showing a method for prognostic and health monitoring of a light fixture in accordance with certain example embodiments.

FIG. 5 is a flowchart showing a method 599 for prognostic and health monitoring of a light fixture in accordance with certain example embodiments. While the various steps in the flowchart presented herein are described sequentially, one of ordinary skill will appreciate that some or all of the steps may be executed in different orders, may be combined or omitted, and some or all of the steps may be executed in parallel. Further, in one or more of the example embodiments, one or more of the steps described below may be omitted, repeated, and/or performed in a different order. In addition, a person of ordinary skill in the art will appreciate that additional steps may be included in performing the methods described herein. Accordingly, the specific arrangement of steps shown should not be construed as limiting the scope. Further, in one or more example embodiments, a particular computing device, as described, for example, in FIG. 2 above, is used to perform one or more of the method steps described herein.

Referring to FIGS. 1-5, in step 572, various information regarding the light fixture 102 is collected. In certain example embodiments, the information is measured by sensors 160 at the direction of the PHM engine 106 of the PHM system 104. The information can be stored in the storage repository 130 as stored data 134. Examples of such information can include, but is not limited to, temperatures, humidity, and vibration. Such information can be called stress information. The various information can be associated with a time as determined by the real-time clock 110. The stress information can be relative to the light fixture 102, other light fixtures located in similar environments as the light fixture 102, other light fixtures using the same technology as the light fixture 102, other light fixtures from the same manufacturer as the light fixture 102, other light fixtures in the same facility as the light fixture 102, and/or light fixtures having some other relevant relationship to the light fixture 102.

In step 574, usage information is collected. In certain example embodiments, the usage information is measured by sensors 160 and/or the energy metering module 111 at the direction of the PHM engine 106 of the PHM system 104. The information can be stored in the storage repository 130 as stored data 134. Examples of such information can include, but are not limited to, current, voltages, resistance, VARs, hours of operation, light output, dimming level, and capacitance. The usage information can be with respect to the entire light fixture 102 or components (e.g., subsystems) thereof. Examples of components of the light fixture 102 can include, but are not limited to, the light sources 142, the power supply 140, and the housing 103.

The various usage information can be associated with a time as determined by the real-time clock 110. The usage information can be relative to the light fixture 102, other light fixtures located in similar environments as the light fixture 102, other light fixtures using the same technology as the light fixture 102, other light fixtures from the same manufacturer as the light fixture 102, other light fixtures in the same facility as the light fixture 102, and/or light fixtures having some other relevant relationship to the light fixture 102.

In step 576, one or more algorithms 133 are run. The algorithms 133 (e.g., models) can be run by the PHM engine 106. The algorithms 133 can use the stress information collected in step 572 and/or the usage information collected in step 574. In step 578, the remaining useful life of the light fixture 102 (or portion thereof) is determined. Determining the remaining useful life of the light fixture 102 (or portion thereof) can be performed by the PHM engine 106 and can be based on the outputs of the algorithms 133 run in step 576. Once step 578 is complete, the process proceeds to step 588. The life estimation determined in step 578 can be based on one or more sources of data, including but not limited to real-time stress data (from step 572), real-time usage information (from step 574), and life-stress models (or other type of algorithm 133) stored in the storage repository 130.

Steps 582-586 of the method 599 are based, in part, on the "canary in a coalmine" theory described above. In step 582, operational data of the light fixture 102 is collected. In certain example embodiments, the operational data is measured by sensors 160 and/or the energy metering module 111 at the direction of the PHM engine 106 of the PHM system 104. The operational data can be stored in the storage repository 130 as stored data 134. Examples of such operational data can include, but is not limited to, output current (e.g., RMS, peak-to-peak), input voltage and current, output voltage, temperature of one or more components, equivalent series resistance of capacitors and contacts, and air quality of the portion of the cavity 103 in which the light sources 142 are disposed.

The various operational data can be associated with a time as determined by the real-time clock 110, which can include a clock in an application/server of a user 150. The operational data can be relative to the light fixture 102, other light fixtures located in similar environments as the light fixture 102, other light fixtures using the same technology as the light fixture 102, other light fixtures from the same manufacturer as the light fixture 102, other light fixtures in the same facility as the light fixture 102, and/or light fixtures having some other relevant relationship to the light fixture 102.

In step 584, the status of one or more "canaries" is checked. The status of the canaries can be determined by the PHM engine 106 using one or more algorithms 133. The status of the canaries can also be determined using information (e.g., stress information, usage information, operational data), measured by sensors 160 and/or the energy metering module 111, and stored as stored data 134 in the storage repository 130.

In step 586, the PHM engine 106 determines whether certain values exceed or fall below one or more threshold values. The threshold values can be stored in the storage repository 130 as stored data 133. The values that are compared to the threshold values can be results of one or more algorithms 133 and/or measurements made by the sensors 160 and/or the energy metering module 111.

The useful life estimations made in steps 572-578 could have different factors (e.g., higher statistical uncertainty) compared to the useful life prediction approach discussed in steps 582-586. However, the method described in steps 572-578 can, in some cases, provide a notice to users 150 that gives the user 150 an adequate time to respond. The useful life prediction approach in steps 582-586 could provide a more accurate prediction of impeding failure and its cause, but it may not, in some cases, provide adequate time for users 150 to respond to a failure before the failure occurs. As a result, in some cases, both approaches can be utilized simultaneously. Alternatively, depending on any of a number of factors (e.g., application requirements with regard to warning time requirement, accuracy requirement, cost considerations) example embodiments may use only one of these approaches. In addition, or in the alternative, other methods of determining the health of a light fixture 102 and/or prognosticating the integrity of a light fixture 102, as described herein, can be used.

In step 588, the PHM engine 106 communicates with a user 150. For example, the PHM engine 106 communicates the results of step 578 and/or step 586 to a user 150. The communication can be one or more of a number of types of communications made to one or more users 150. For example, the communication can be an alert to an engineer. As another example, the communication can be placing an order for a new light fixture (or one or more components thereof) with an inventory management system. As another example, the communication can be scheduling a maintenance crew to repair or replace the light fixture 102 (or portion thereof) with a workforce scheduling system. Any of the steps above can be repeated, or the process can revert to a previous step after the completion of a subsequent step.

Example embodiments can generate estimates of the remaining useful life of a light fixture or components thereof based on actual, real-time data. Example embodiments can also detect, in real time, instantaneous failures of one or more components of a light fixture. Example embodiments can predict the failure of a light fixture (or components thereof) to improve the safety of industrial environments in which the light fixture is disposed. Example embodiments can also help ensure efficient allocation of maintenance resources within a facility. Example embodiments can further provide a user with options to prolong the useful life of a light fixture or components thereof.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. A light fixture comprising:
   at least one light fixture component;
   at least one first sensor that measures a current or a voltage associated with the at least one light fixture component while the at least one light fixture component is operating;
   at least one second sensor that measures at least one environmental parameter associated with the at least one light fixture component while the at least one light fixture component is operating; and
   a prognostic and health monitoring (PHM) system coupled to the at least one first sensor and the at least one second sensor, wherein the PHM system:

analyzes a first plurality of measurements of the current or the voltage, as measured by the at least one first sensor while the at least one light fixture component is operating, in relation to a second plurality of time-correlated measurements of the at least one environmental parameter, as measured by the at least one second sensor while the at least one light fixture component is operating;

establishes ranges of acceptable values of the current or the voltage based on correlating the first plurality of measurements and the second plurality of time-correlated measurements over a time;

compares a first actual measurement of the current or the voltage, as measured by the at least one first sensor at a first subsequent time, to one of the ranges of acceptable values that correlates to a first particular value of the at least one environmental parameter measured by the at least one second sensor at the first subsequent time; and predicts longevity of the at least one light fixture component based on comparing the first actual measurement to the one of the ranges of acceptable values.

2. The light fixture of claim 1, wherein the at least one light fixture component comprises at least one selected from a group consisting of a power supply, an additional sensor, a light source, and a battery.

3. The light fixture of claim 1, wherein the PHM system comprises a PHM engine to analyze the first plurality of measurements and the second plurality of time-correlated measurements.

4. The light fixture of claim 3, wherein the PHM engine uses at least one algorithm to analyze the first plurality of measurements and the second plurality of time-correlated measurements.

5. The light fixture of claim 1, wherein the first plurality of measurements and the second plurality of time-correlated measurements are associated with at least one light fixture component of other light fixtures.

6. The light fixture of claim 1, wherein the first actual measurement falls outside the one of the ranges of acceptable values.

7. The light fixture of claim 1, wherein the PHM system sends a communication to a user, wherein the communication is associated with results of predicting the longevity of the at least one light fixture component.

8. The light fixture of claim 1 wherein the at least one second sensor is coupled to a housing of the light fixture.

9. The light fixture of claim 8, wherein the at least one second sensor comprises a safety barrier, thereby making the at least one second sensor intrinsically safe.

10. The light fixture of claim 1, wherein the light fixture further comprises a housing designed to comply with applicable standards for a hazardous environment.

11. The light fixture of claim 1, wherein the at least one light fixture component comprises a plurality of light fixture components, wherein the plurality of light fixture components comprises a test component, wherein the test component is known to fail at a faster rate than a remainder of the plurality of light fixture components, wherein the PHM system compares the first actual measurement of the current or the voltage associated with the test component to the one of the range of acceptable values.

12. The light fixture of claim 11, wherein the PHM system determines a remaining useful life of the remainder of the plurality of light fixture components based on analyzing the first actual measurement associated with the test component.

13. The light fixture of claim 1, wherein the at least one environmental parameter comprises at least one selected from a group consisting of a temperature, a humidity level, and a vibration amount.

14. The light fixture of claim 1, wherein at a second subsequent time after the first subsequent time the first actual measurement becomes part of the first plurality of measurements and the first particular value becomes part of the second plurality of time-correlated measurements.

15. The light fixture of claim 14, wherein the ranges of acceptable values are re-established at the second subsequent time.

16. The light fixture of claim 15, wherein the PHM system further:

compares a second actual measurement of the current or the voltage, as measured by the at least one first sensor at a third subsequent time, to another of the ranges of acceptable values that correlates to a second particular value of the at least one environmental parameter measured by the at least one second sensor at the third subsequent time; and predicts the longevity of the at least one light fixture component based on comparing the second actual measurement to the another of the ranges of acceptable values, wherein the third subsequent time is after the second subsequent time.

17. A prognostic and health monitoring (PHM) system for a light fixture, the system comprising:

a PHM engine that is configured to:

receive a first plurality of measurements of a current or a voltage associated with a light fixture component of the light fixture, as measured by at least one first sensor over time, and a second plurality of time-correlated measurements of at least one environmental parameter, as measured by at least one second sensor over the time, while the light fixture component is operating;

establish ranges of acceptable values of the current or the voltage based on correlating the first plurality of measurements and the second plurality of time-correlated measurements over the time;

compare an actual measurement of the current or the voltage, as measured by the at least one first sensor at a subsequent time, to one of the ranges of acceptable values that correlates to a particular value of the at least one environmental parameter measured by the at least one second sensor at the subsequent time; and predict longevity of the light fixture component based on comparing the actual measurement to the one of the ranges of acceptable values.

18. The PHM system of claim 17, further comprising:

a storage repository coupled to the PHM engine, wherein the storage repository stores the first plurality of measurements and the second plurality of time-correlated measurements.

19. The PHM system of claim 17, further comprising:

a communication module coupled to the PHM engine, wherein the communication module allows the PHM engine to notify a user as to at least one factor that affects the longevity of the light fixture component.

20. The PHM system of claim 17, further comprising:

a memory comprising a plurality of instructions;

a hardware processor that executes the plurality of instructions stored in the memory, wherein the PHM engine uses the plurality of instructions to predict the longevity of the light fixture component.

\* \* \* \* \*